United States Patent
Chen et al.

(10) Patent No.: US 9,697,993 B2
(45) Date of Patent: *Jul. 4, 2017

(54) NON-AMBIPOLAR PLASMA EHNCANCED DC/VHF PHASOR

(71) Applicant: Tokyo Electron Limited, Minato-ku, Tokyo (JP)

(72) Inventors: Lee Chen, Cedar Creek, TX (US); Zhiying Chen, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/534,460

(22) Filed: Nov. 6, 2014

(65) Prior Publication Data

US 2015/0126037 A1    May 7, 2015

Related U.S. Application Data

(60) Provisional application No. 61/900,689, filed on Nov. 6, 2013.

(51) Int. Cl.
| | | |
|---|---|---|
| *C23F 1/00* | (2006.01) | |
| *H01L 21/306* | (2006.01) | |
| *H01J 37/32* | (2006.01) | |

(52) U.S. Cl.
CPC .... *H01J 37/32935* (2013.01); *H01J 37/3244* (2013.01); *H01J 37/32091* (2013.01); *H01J 37/32165* (2013.01); *H01J 37/32697* (2013.01); *H01J 37/32899* (2013.01)

(58) Field of Classification Search
USPC .......... 156/345.38, 345.28, 345.29
See application file for complete search history.

(56) References Cited

U.S. PATENT DOCUMENTS

| | | | |
|---|---|---|---|
| 5,952,896 A * | 9/1999 | Mett | H03H 7/38 333/32 |
| 6,462,482 B1 * | 10/2002 | Wickramanayaka | C23C 14/35 118/723 E |
| 7,993,937 B2 | 8/2011 | Chen et al. | |
| 2005/0208217 A1 * | 9/2005 | Shinriki et al. | 427/248.1 |
| 2006/0073700 A1 * | 4/2006 | Brown | C23C 14/046 438/643 |
| 2007/0062645 A1 * | 3/2007 | Fukuchi | 156/345.24 |
| 2007/0235420 A1 * | 10/2007 | Yamazawa | 219/121.36 |
| 2007/0246163 A1 * | 10/2007 | Paterson | C23C 16/458 156/345.48 |
| 2009/0236314 A1 * | 9/2009 | Chen | H01J 37/32091 216/67 |

(Continued)

*Primary Examiner* — Keath Chen
(74) *Attorney, Agent, or Firm* — Rothwell, Figg, Ernst & Manbeck, P.C.

(57) ABSTRACT

This disclosure relates to a plasma processing system for controlling plasma density across a substrate and maintaining a tight ion energy distribution within the plasma. In one embodiment, this may include using a dual plasma chamber system including a non-ambipolar plasma chamber and a DC plasma chamber adjacent to the non-ambipolar system. The DC plasma chamber provide power to generate the plasma by rotating the incoming power between four inputs from a VHF power source. In one instance, the power to each of the four inputs are at least 90 degrees out of phase from each other.

16 Claims, 4 Drawing Sheets

(56) References Cited

U.S. PATENT DOCUMENTS

2011/0192349 A1* 8/2011 Hammond, IV ...... C23C 16/509
  118/723 E
2013/0119854 A1 5/2013 Lane et al.
2013/0122711 A1* 5/2013 Marakhtanov et al. ...... 438/711

* cited by examiner

NON-AMBIPOLAR PLASMA EHNCANCED DC/VHF PHASOR

CROSS REFERENCE TO RELATED APPLICATION

Pursuant to 37 C.F.R. §1.78(a)(4), this application claims the benefit of and priority to prior filed Provisional Application Ser. No. 61/900,689 filed Nov. 6, 2013, which is expressly incorporated herein by reference.

FIELD OF THE INVENTION

This invention relates to semiconductor processing technology, and more particularly, to apparatus and methods for controlling plasma properties of a processing system for treating a substrate.

BACKGROUND OF THE INVENTION

Plasma uniformity control during plasma processing for treating semiconductor substrates is important to achieve patterning structures on a substrate or controlling the amount of material removed from or deposited on or into the substrate. A plasma processing system may include a large distance or gap between the plasma source and the substrate. A chamber wall of the plasma processing system may be disposed between the plasma source and the substrate. As a result, ions and electrons in the plasma may be influenced by the potential difference between the plasma and the chamber wall which may result in plasma density non-uniformity. This may have negative impact on the uniformity of structures within the semiconductor devices being built in or on the substrate. For example, a lower plasma density at the edge of the substrate may induce a lower etch or deposition rate at the edge of the substrate than at the center of the substrate. As a result, the semiconductors may perform differently depending on whether they are near the center or the edge of the substrate. Ideally, semiconductor devices should perform in a predictable manner or range regardless of whether they were at the center or the edge of the substrate. Hence, systems and methods that improve plasma density profile uniformity may be desirable.

SUMMARY OF THE INVENTION

This disclosure relates to a plasma processing system for controlling plasma density profile across a substrate from the center to near the edge or perimeter of a substrate. The plasma processing system may include a plasma chamber that can receive and process the substrate using plasma for etching the substrate, doping the substrate, and/or depositing a film on the substrate.

The plasma chamber may include one or more plasma power sources that can emit electromagnetic energy to ionize gas that is delivered into the plasma chamber via a gas delivery system. The one or more plasma sources may influence the plasma density within the plasma chamber. In one embodiment, one of the plasma sources may induce a center high density profile, such that the plasma density near the center of the substrate may be higher than that an edge or perimeter of the substrate. Another plasma power source may be used to induce a center low plasma density profile within the plasma chamber. In this instance, the plasma density may be higher at the edge or perimeter of the substrate than at the center. In this way, the two or more plasma power sources may offset each other and form a plasma density that has a higher degree of uniformity across the substrate.

In one embodiment, one of the plasma power sources may include non-ambipolar plasma chamber that may be used to generate a center-high plasma density profile in an adjacent chamber. This may be accomplished by injecting electrons into the adjacent chamber from the non-ambipolar chamber using non-ambipolar diffusion of charged particles. The non-ambipolar diffusion may occur between regions of different localized plasma potential. The diffusion may include the exchange of ions and electrons between the regions or chambers, in that the first region (e.g., inside the non-ambipolar plasma chamber) may diffuse electrons towards a second plasma region and that the second region (e.g., second plasma chamber) may diffuse ions towards the first plasma region (e.g., non-ambipolar plasma chamber) in a systematic manner. The diffusion of ions and electrons in opposing directions may enable the generation of plasma within the second plasma chamber. However, the plasma may have a relatively non-uniform plasma density profile across the substrate. One approach to address the non-uniformity may be to apply a second power source to the plasma that may improve the plasma density profile non-uniformity. The may be accomplished by applying electromagnetic energy using a very high frequency (VHF) phasor electrode that introduces power near the edge of the substrate in a systematic way that decreases the center-to-edge non-uniformity of the plasma. The VHF source may also tighten the ion energy distribution function (IEDf) of the plasma which may result in more uniform processing of the substrate.

In certain instances, the ion energy of the plasma may need to be shifted to accommodate certain processing conditions to treat the substrate. One approach to shift the ion energy may be to apply a direct current (DC) power source to the plasma that may shift ion energy higher or lower depending on the desired process conditions. In this way, the relatively tight IEDf may be maintained at different electron energy conditions.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention. Additionally, the left most digit(s) of a reference number identifies the drawing in which the reference number first appears.

DETAILED DESCRIPTION

The following Detailed Description refers to accompanying drawings to illustrate exemplary embodiments consistent with the present disclosure. References in the Detailed Description to "one embodiment," "an embodiment," "an exemplary embodiment," etc., indicate that the exemplary embodiment described can include a particular feature, structure, or characteristic, but every exemplary embodiment does not necessarily include the particular feature, structure, or characteristic. Moreover, such phrases are not necessarily referring to the same embodiment. Further, when a particular feature, structure, or characteristic is described in connection with an embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other embodiments are possible, and modifications can be made to exemplary embodiments within the scope of the present disclosure. Therefore, the Detailed Description is not meant to limit the present disclosure. Rather, the scope of the present disclosure is defined only in accordance with the following claims and their equivalents.

The following Detailed Description of the exemplary embodiments will so fully reveal the general nature of the present disclosure that others can, by applying knowledge of those skilled in the relevant art(s), readily modify and/or adapt for various applications such exemplary embodiments, without undue experimentation, without departing from the scope of the present disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not limitation, such that the terminology or phraseology of the present specification is to be interpreted by those skilled in relevant art(s) in light of the teachings herein.

Figure 1:
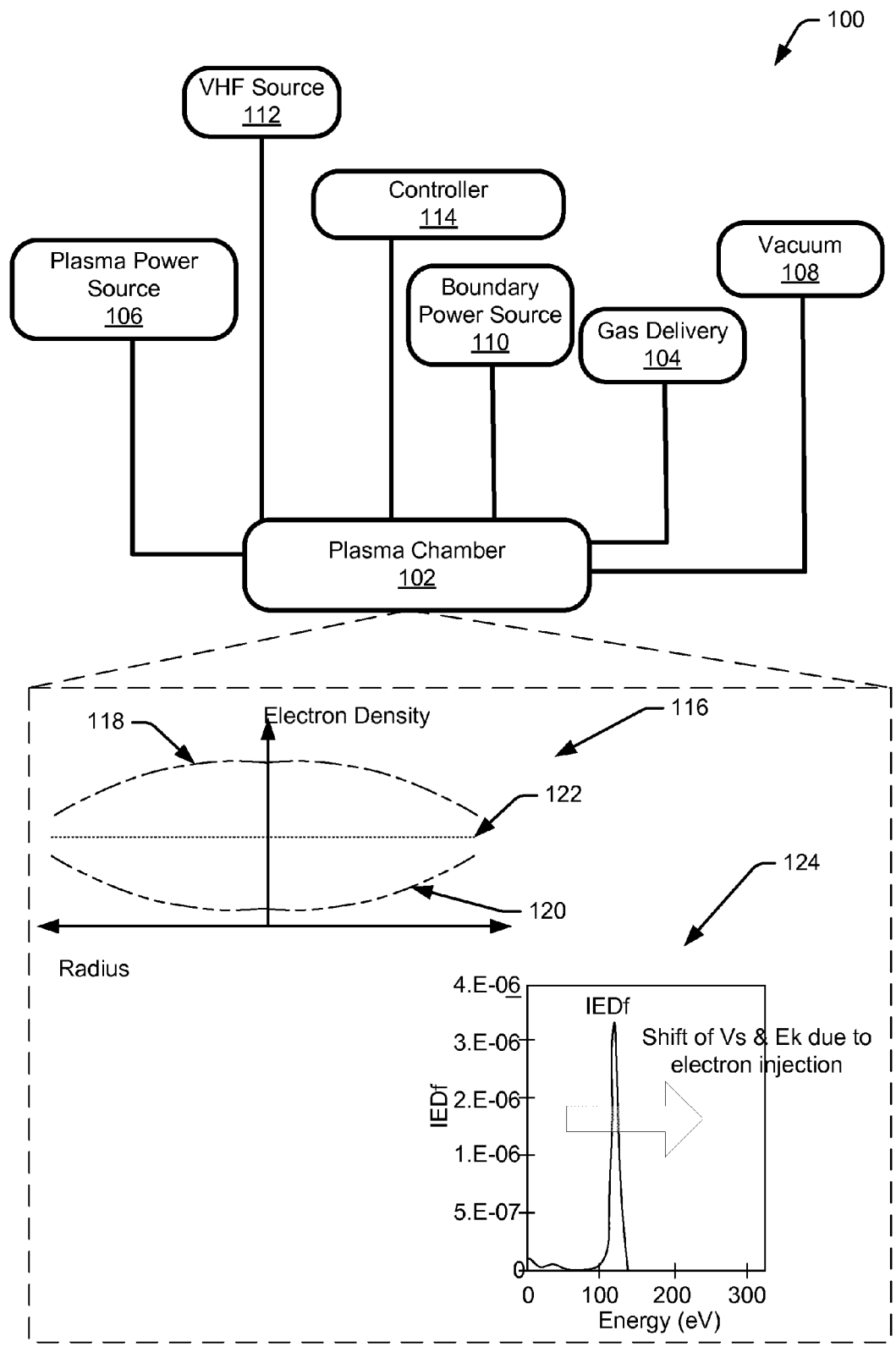
FIG. 1 is an illustration of a representative embodiment of a non-ambipolar plasma system processing system that includes a schematic illustration of the system and illustrations of the performance of the plasma processing system.

FIG. 1 depicts a plasma processing system 100 for treating substrates using plasma (not shown) that is generated in plasma chamber 102. Plasma may be generated in the plasma chamber 102 by ionizing gas that is provided by a gas delivery system 104 and exposing the gas to electromagnetic energy provided by one or more power sources (e.g., plasma power source 106, boundary power source 110, Very High Frequency (VHF) power source 112). A vacuum system 108 may also maintain a sub-atmospheric pressure within the plasma chamber 102 during plasma generation.

Plasma generation may be done by applying electromagnetic energy to an electrically neutral gas to cause negatively charged electrons to be released from a gas molecule that is positively charged as result of the lost electron. In one embodiment, the electromagnetic energy may be transmitted to the gas via one or more electrodes (not shown) disposed within the plasma chamber 102. Over time, the electromagnetic energy and the increasing electron collisions within the gas may increase the density of ionized molecules within the gas, such that the ionized molecules may be influenced by potential differences within the plasma chamber 102. For example, the potential differences within the plasma chamber 102 may direct the ionized molecules towards a substrate (not shown). The ionized molecules may interact with the substrate or treat the substrate in a way that may remove a portion of the substrate or may be deposited on the substrate. In this way, patterns may be etched into the substrate or films may be deposited on the substrate.

Plasma density across the plasma chamber 102 may impact the uniformity of the plasma treatment of the substrate. The plasma density may be ion molecule density within a volume within the plasma chamber 102. Plasma processing uniformity may be impacted when the plasma density varies across the substrate such that higher plasma density at the center of the substrate may cause a higher etch rate than the etch rate at the edge of the substrate.

Generally, this process non-uniformity may be the result of ion loss to the chamber wall, specifically for a wide gap between the plasma source and the substrate holder. The non-uniformity may be illustrated by the plasma density graph 116 that shows the primary density profile 118 that may be generated by using the plasma power source 106 and the secondary density profile 120 that may be generated by the VHF source 112. The interaction between the primary density profile 116 and the secondary density profile 120 may result in an adjusted profile 122. Under the principle of superposition, the density distributions may offset each other such that the center high distribution (e.g., primary density profile 118) may be offset by the center low distribution (e.g., secondary density profile 120) to provide a more uniform density profile (e.g., adjusted density profile 120) across the substrate.

Another aspect of using the VHF source 112 may include generating a relatively narrow ion energy distribution within the plasma, as shown in the IEDf plot 124. The ion energy ($E_k$) may be distributed over relatively a narrow range of energy (eV) (e.g., <40 eV) and the peak IEDf may be less than 200 eV. One approach to get the energy above 200 eV may be to apply use a relatively large power to the VHF electrode (not shown). However, the plasma may negatively impacted by harmonics from the high power VHF signal to the VHF electrode. Hence, it may be desirable to shift the distribution of the IEDf without introducing the harmonic effects. One approach to shifting the IEDf may be to adjust the sheath voltage ($V_s$) of the plasma by introducing additional electrons into the plasma. Additional electrons may be introduced to the plasma using a dual plasma chamber system that uses one chamber to generate electrons and inject them into the second chamber where the substrate may be treated. The dual chamber system will be described in detail in the description of FIG. 2. The process conditions to enable the plasma may be controlled by a controller 114 that may control the pressure, temperature, time, power sources, and gas flow to implement the plasma processes described above.

The controller 114 may comprise a microprocessor, memory, and a digital I/O port capable of generating control signals sufficient to communicate and activate inputs to the system 100 as well as monitor outputs from the processing in the plasma chamber 102. Moreover, controller 114 can be coupled to and can exchange information with plasma generation system including gas system 104 and plasma power source 106, boundary power source 110, and vacuum pumping system 108. For example, a program stored in the memory can be utilized to activate the inputs to the aforementioned components of the system 100 according to a process recipe in order to perform methods for treating the substrate.

The interactions and functions of the components of the system 100 may be managed or controlled by a controller 114. In one embodiment, the controller 114 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 114 includes at least one computer readable tangible storage medium or memory, such as the controller memory, for holding instructions programmed according to the teachings of the invention and for containing data structures, tables, records, or other data that may be necessary to implement the present invention.

The term "computer readable medium" as used herein refers to any medium that participates in providing instructions to the processor of the controller 114 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 114.

Stored on any one or on a combination of computer readable media, the invention includes software for controlling the controller 114, for driving a device or devices for implementing the invention, and/or for enabling the controller to interact with a human user. Such software may include, but is not limited to, device drivers, operating systems, development tools, and applications software. Such computer readable media further includes the computer program product of the invention for performing all or a portion (if processing is distributed) of the processing performed in implementing the invention.

The computer code devices may be any interpretable or executable code mechanism, including but not limited to, scripts, interpretable programs, dynamic link libraries (DLLs), Java classes, and complete executable programs. Moreover, parts of the processing may be distributed for better performance, reliability, and/or cost.

Controller 114 may be locally located relative to the system 100, or it may be remotely located relative to the system 100 via an internet or intranet. Thus, controller 114 can exchange data with the system 100 using at least one of a direct connection, an intranet, or the internet. Controller 114 may be coupled to an intranet at a customer site (i.e., a device maker, etc.), or coupled to an intranet at a vendor site (i.e., an equipment manufacturer). Furthermore, another computer (i.e., controller, server, etc.) can access controller 114 to exchange data via at least one of a direct connection, an intranet, or the internet.

Figure 2:
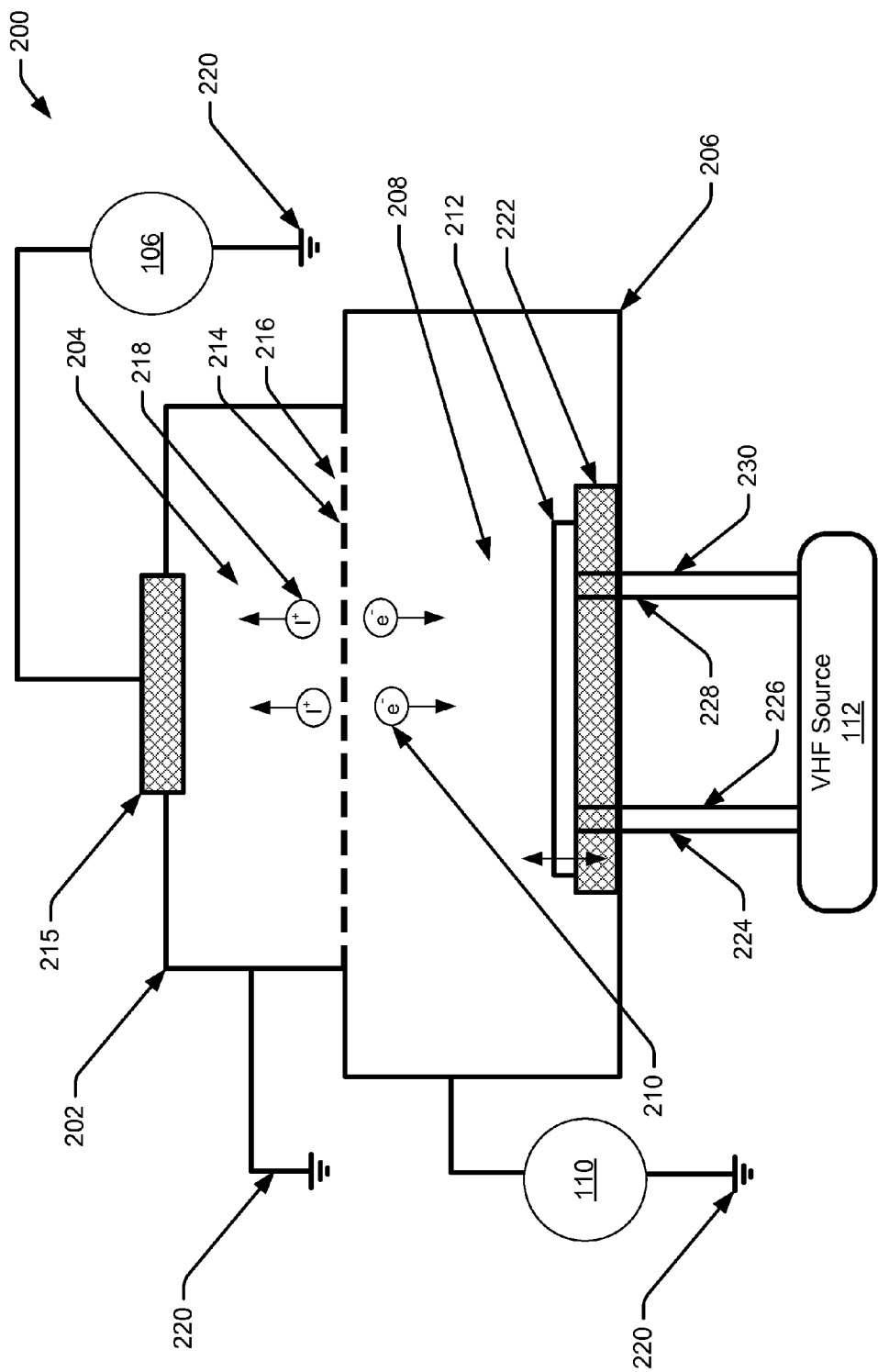
FIG. 2 is a schematic cross-sectional illustration of one embodiment of the non-ambipolar plasma system processing system.

FIG. 2 is a schematic cross-sectional illustration of one embodiment of the non-ambipolar plasma system processing system 200 comprising a first plasma chamber 202 for forming a first plasma 204 at a first plasma potential ($V_{p,1}$), and a second plasma chamber 206 for forming a second plasma 208 at a second plasma potential ($V_{p,2}$) greater than the first plasma potential. The first plasma 204 may be formed by coupling power, such as radio frequency (RF) power, to an ionizable gas in the first plasma chamber 202, while the second plasma 208 may be formed using electron flux 210 (e.g., energetic electron (ee) current, $j_{ee}$) from the first plasma 204. Further, the system 200 may also include a substrate holder configured to position a substrate 212 at direct current (DC) ground or floating ground, in the second plasma chamber 206, and to expose the substrate 212 to the second plasma 208 at the second plasma potential. The substrate holder may include a phasor electrode (described in the description of FIG. 3) that may be coupled to the VHF source 112.

The first plasma chamber 202 may include a plasma generation system configured to ignite and/or heat the first plasma 204 to the first plasma potential ($V_{p,1}$). The plasma generation system may include, but may not require, the plasma power source 106 that may be coupled to a primary electrode 215 that may be electrically isolated from the chamber walls which may be coupled to electrical ground 220. The plasma power source 106 may be any conventional plasma generation system including, but not limited to, an inductively coupled plasma (ICP) source, a transformer coupled plasma (TCP) source, a capacitively coupled plasma (CCP) source, an electron cyclotron resonance (ECR) source, a helicon wave source, a surface wave plasma source, a surface wave plasma source having a, slotted plane antenna, etc. Although the first plasma 204 may be heated by any plasma source, it is desired that the first plasma. 204 may be heated by a method that produces a reduced or minimum fluctuation in its plasma potential $V_{p,1}$. For example, an ICP source is a practical technique that produces a reduced or minimum $V_{p,1}$ fluctuation.

Additionally, the first plasma chamber 202 comprises a direct current (DC) conductive ground electrode having a conductive surface that acts as a boundary in contact with the first plasma 204 and may be incorporated into the chamber walls of the first plasma chamber 202, as shown in FIG. 2. The DC conductive ground electrode may be coupled to DC ground 220. The DC conductive ground electrode may act as an ion sink that is driven by the first plasma 204 at the first plasma potential ($V_{p,1}$). Although not necessary, it is desirable that the DC conductive ground electrode comprises a relatively large area in contact with the first plasma 204. The larger the area of the DC ground electrode, the lower the first plasma potential. For example, the surface area of the conductive surface for the DC conductive ground electrode in contact with the first plasma 204 may be greater than any other surface area in contact with the first plasma 204. Alternatively, as an example, the conductive surface for the DC conductive ground electrode may be in contact with the first plasma 204 may be the only conductive surface that is in contact with the first plasma 204. The DC conductive ground electrode may offer the lowest impedance path to ground from the first plasma 204.

As described above, (energetic) electron flux (or electron current $j_{ee}$) from the first plasma 204 initiates and sustains the second plasma 208 in the second plasma chamber 206. In order to control the electron flux 210 and produce a mono-energetic space-charge neutralized neutral beam, the first plasma potential ($V_{p,1}$), as described above, and the second plasma potential ($V_{p,2}$) should be stable with substantially reduced or minimal fluctuations if any fluctuations at all. To achieve this stability in the second plasma 208, the second plasma chamber 206 comprises a DC conductive bias electrode (shown as the chamber wall in FIG. 2) having a conductive surface in contact with the second plasma 208, wherein the DC conductive bias electrode is coupled to a DC voltage source (e.g., boundary power source 110). The DC voltage source is configured to bias the DC conductive bias electrode at a positive DC voltage ($V_{DC}$). As a result, the second plasma potential ($V_{p,2}$) is a boundary-driven plasma potential driven by a ($V_{DC}$) voltage source, thus causing $V_{p,2}$ to rise to about $-V_{DC}$ and remain substantially stable. Although one DC conductive bias electrode is shown in FIG. 2, the system 200 may comprise one or more DC conductive bias electrodes.

Furthermore, the plasma processing system 200 comprises a separation member 214 disposed between the first plasma chamber 202 and the second plasma chamber 206. The separation member 214 may act as an electron 210 diffuser. The electron diffusion is driven by an electric field through an electron acceleration layer created by the potential difference $V=V_{p,2}-V_{p,1}$. The separation member 214 may comprise an insulator, such as quartz or alumina, or the separation member 214 may comprise a dielectric coated conductive material that is electrically floating and has high RF impedance to ground. Due to the large electric field across the electron acceleration layer ($V_z(V_{p,2}-V_{p,1})$), the electron flux is sufficiently energetic to sustain ionization in the second plasma 208. However, the system 200 may optionally comprise a plasma heating system (not shown) configured to further heat the second plasma 208.

The separation member 214 may comprise one or more openings 216 to permit the passage of the energetic electron flux 210 from the first plasma chamber 202 to the second plasma chamber 206 and energetic ion flux 218 from the second plasma chamber 206 into the first plasma chamber 202. The total area of the one or more openings 216 can be adjusted relative to the surface area of the DC conductive ground electrode to ensure a relatively large potential difference $V=V_{p,2}-V_{p,1}$ while minimizing reverse ion current from the second plasma 208 to the first plasma 204, and thereby ensure a sufficient ion energy for ions striking the substrate 25.

The first ion flux 218 (e.g., ion current, $j_{i1}$) from a first population of ions in the second plasma 208 flows to the DC conductive ground electrode in the first plasma chamber 202 in a quantity approximately equivalent to the energetic electron flux 210 (or electron current $j_{ee}$) from the first plasma 204 through the electron acceleration layer at the separation member 214 into the second plasma 208.

As described above, the energetic electron flux 210 is sufficiently energetic to form the second plasma 208. Therein, a population of thermal electrons and a second population of ions are formed. The thermal electrons are largely a result of ejected electrons upon ionization of the second plasma 208 by the incoming energetic electron flux 210 (or electron current $j_{ee}$). However, some energetic electrons from the energetic electron flux may lose a sufficient amount of energy and, thus, become part of the thermal electron population.

Due to Debye shielding, only the thermal electrons of the second plasma 208 flow to the DC conductive bias electrode (e.g., thermal electron current, $j_{te}$) in a quantity approximately equal to the energetic electron flux, i.e., $j_{te}$~$j_{ee}$. While thermal electron current $j_{te}$ is directed to the DC conductive bias electrode, a second ion flux (not shown) from the second population of ions is directed to the substrate at $V_{p,2}$ (as ion current, $j_{i2}$).

If the incoming energetic electron energy is sufficiently high, a substantial fraction of the energetic electron flux ($j_{ee}$) will survive the passage through the second plasma 208 and strike the substrate 212. However, regardless of their origin (i.e., energetic electrons from energetic electron flux $j_{ee}$ or energetic electrons from the thermal electron population), only energetic electrons capable of passing through the substrate sheath (i.e. climbing the potential "hill") will reach substrate 212. Since substrate 212 is at floating DC ground, the ion current $j_{i2}$ that is fed by the second ion population in the second plasma 208 will be equivalent to the electron current $j_{e2}$ (i.e., no net current, or $j_{i2}$~$j_{e2}$). Alternatively, the substrate 212 may be at approximately DC ground since the floating-ground surface potential is expected to be slightly above DC ground.

In such a configuration for the system 200, the elevation of the second plasma potential above the first plasma potential drives an energetic electron beam (having electron current $j_{ee}$) to form the second plasma 208, while particle balance throughout the system 200 enforces an equal number of electrons (e.g., electron current, $j_{e2}$) and ions (e.g., ion current, $j_{i2}$) striking the substrate 212 (i.e., $j_{i2}$~$j_{e2}$). This charge balance manifests as a space-charge neutralized neutral beam directed to substrate 212 that activates a chemical process at the substrate 212. In one embodiment, the up-shift of the $V_S$ (and hence, $E_K$) is achieved by bombarding the wafer surface with the right amount of power of energetic electrons. $V_S$ is the effective sheath potential formed across the substrate 212. For example, a −800V DC-top will result in the bombardment of the wafer surface with a broad spectrum of EEDf of electrons with peak-energy passing the ~800 eV mark. As a result, the DC sheath $V_S$ will be driven to ~800V below its normal (i.e., with top being at ground) level; that is on top of the VHF-Phasor RIE situation (e.g., the ~120 eV $E_K$). As a result, an $E_K$ of ~120+800~900 eV may be expected. The second plasma chamber 206 may also include a variable gap system (not shown) that may vary the distance between the substrate 212 and the separation member 214. In addition to the combination of high-negative DC and VHF-Phasor shifting the $E_K$ to the higher energy regime, but adjusting the distance can also alter or tune the adjusted plasma density profile 122 shown in the plasma density profile plot 116. For example, the gap distance may be adjusted between 1 cm to 50 cm.

In the FIG. 2 embodiment, the system 200 may also include a phasor electrode 222 disposed between the substrate and the VHF source 112. The phasor electrode 222 may be used to provide electromagnetic energy to form the second plasma density profile 120 within the second plasma chamber 206. The phasor electrode 222 may provide an alternating source of energy to at least four points adjacent to the substrate 212. The energy provided to each point may be out of phase with each other, such that in the FIG. 2 embodiment, the four signals may be out of phase by about 90 ninety degrees or between 60 and 120 degrees. For example, the first output 224 may be out of phase with the second output 226, third output 228, and the fourth output by at least 90 degrees in one embodiment. In this way, the energy provided to the second plasma chamber 206 may appear to alternate or rotate around the substrate 212 between the four outputs. In one embodiment, the outputs may be operating at the same or similar frequency, such as 100 MHz. However, the frequency may vary between 50 MHz and 1 GHz and the power may vary between 50 W and 1500 W.

In one embodiment, the four outputs (e.g., first output 224, second output 226, third output 228, fourth output 230) may symmetrically aligned around the substrate 212, but are not required to be symmetrical. The location of the four outputs may also influence the center low density profile 120 which may be used to offset the center high plasma density profile 118, as shown in FIG. 1. The phasor electrode 222 may be made of any dielectric material that may be able to isolate each of the four output signals from each other. The dielectric material may include, but is not limited to, ceramic or quartz material.

The phasor electrode 222 may be powered by one or more VHF power sources 112, such that the power may be provided out of phase to each output. One approach may be use a single generator which will be described in greater detail in the description of FIG. 3.

Figure 3:
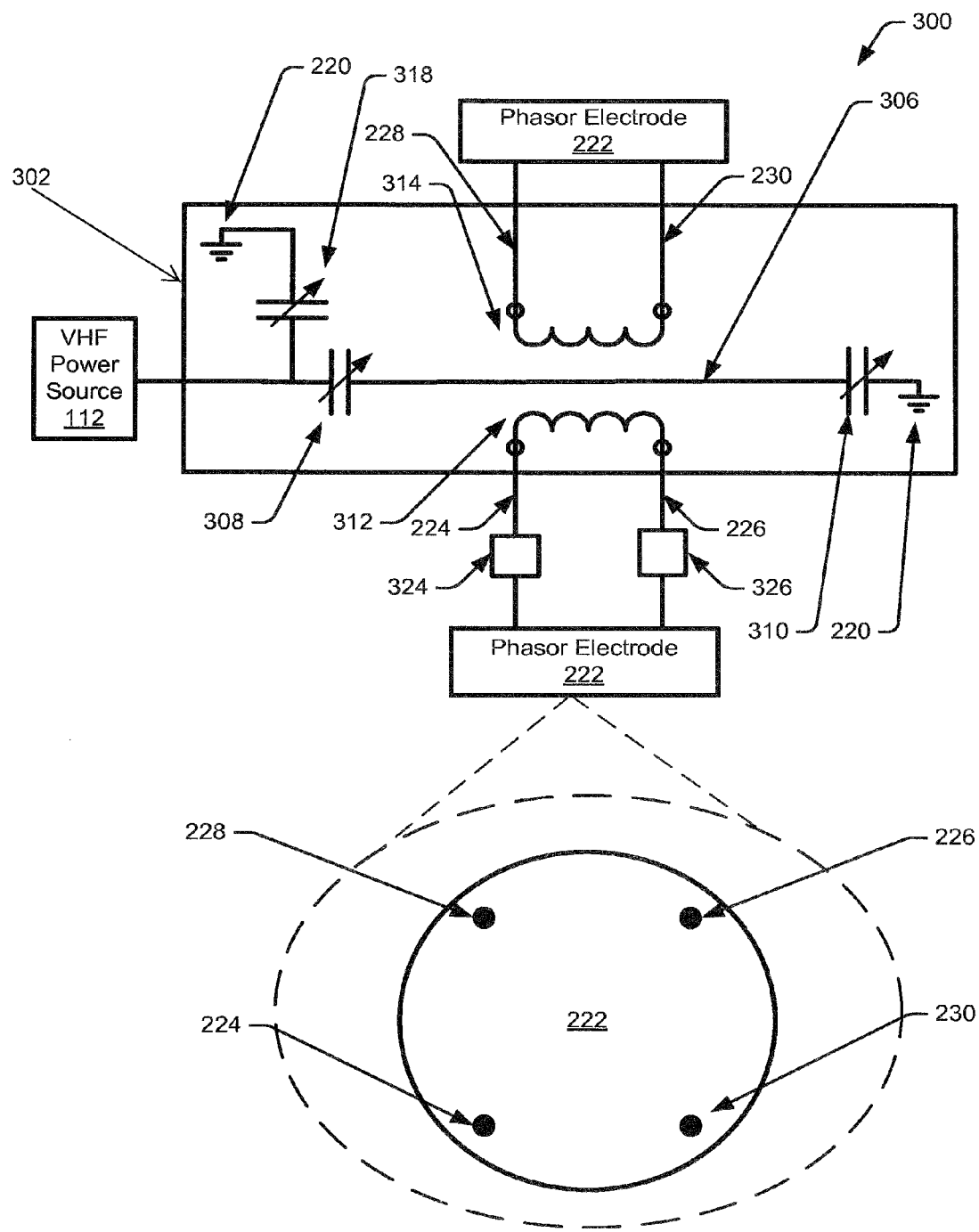
FIG. 3 illustrates one embodiment of the power splitter and impedance matcher and a top view illustration of a phasor electrode.

FIG. 3 illustrates one embodiment of VHF source 112 coupled to a power splitter and impedance matcher 300 and a top view illustration of a phasor electrode 222. In one embodiment, the VHF power source 112 may provide a current signal to the power splitter 302 to divide the current signal into two alternating current signals that may be provided to each of the four outputs ((e.g., first output 224, second output 226, third output 228, fourth output 230). The divided current signals may be out of phase from each other and may each have a distinct output line that may be coupled to the phasor electrode 222 in the second plasma process chamber 206. The power splitter 302 may also include impedance matching components (not shown) that may be controlled to match the impedance of the VHF power source 112 to the phasor electrode 222. The impedance matching may prevent power from being reflected back to the VHF power source 112 from the process chamber 106.

The power splitter 300 may also be tuned to generate a standing wave or resonant wave along a conductive element (not shown). The standing wave may include a node where the voltage signal does not move and may have a minimal or zero magnitude and an antinode that may be the maximum or minimum magnitude of the voltage signal. In this embodiment, the standing wave may have a wavelength and amplitude. In one embodiment, the standing wave may be a half wavelength of the signal from the VHF power source 112. The signal from the VHF power source 112 may generate a voltage signal and a magnetic field within the power splitter 300. In this embodiment, the voltage signal may include a node near the center of a conductive element 306 or approximately a distance of approximately a quarter wavelength along the conductive element 306. The standing wave may be centered along the conductive element 306, such that the node of the voltage signal is near the center of the conductive element 306 and the antinodes may be near the ends of the conductive element 306. Accordingly, the maximum magnitude of the magnetic field may be near the center of the conductive element 306.

In this embodiment, the conductive element 306 may be a rod that may include metallic or conductive elements that enable current to flow the through the rod. The rod may be disposed between a first tuning capacitor 308 and a second tuning capacitor 310 that may be used generate a standing wave along the rod. The tuning capacitors 308, 310 may be adjusted to place the node of the voltage signal and the antinode of the magnetic field near the center of the rod. In one instance, this placement may be ¼ of the wavelength of the signal provided by the VHF power source 112. Accordingly, the distance between the tuning capacitors 308, 310 may be at least ½ of the wavelength of the signal provided by the VHF source 112.

The first and second tuning capacitors 308, 310 may be used to adjust the alternating current flow from the signal received from the VHF power source 112. As the current flow oscillates along the length of the conductive element, the standing waves may be maintained based, at least in part, on the settings of the first and second tuning capacitors 308, 310. The direction of the magnetic field may oscillate based, at least in part, on the direction of the current flow in the conductive element. The direction of the magnetic field may be perpendicular the current flow through the conductive element. For example, as the current flow oscillates along the direction of the conductive element 306, the direction of the magnetic field oscillates in a direction that may be to perpendicular to the direction of the current flow. The oscillation of the current and the magnetic field may oscillate in polarity by approximately 180 degrees. In one specific embodiment, the magnetic field may be oscillating in two opposing directions around the conductive element 306.

In one specific embodiment, the frequency of the alternating current may range between approximately 40 MHz and 200 MHz. The first and second tuning capacitors 308, 310 may range in capacitance between 10 pF and 50 pF to maintain a standing wave of the voltage signal 110 and the magnetic field 112 associated with the alternating current in the conductive element 306. In yet another embodiment, the second tuning capacitor 310 may be omitted from the powers splitter 300. In this instance, the capacitive properties of the conductive element 202 may be used to function as the second tuning capacitor 206. In this way, the first tuning capacitor 308 may be adjusted in view of the capacitive properties of the conductive element 306.

In the FIG. 3 embodiment, when the current flows left to right along the conductive element 306, the magnetic field oscillates around the conductive element 306 in a tangential manner such that the magnetic field oscillates in and out of the two-dimensional plane (e.g., the surface of the page on which the conductive element 306 is drawn) that includes the conductive element 306.

As illustrated in FIG. 3, two or more inductors (e.g., first inductor 312 and second inductor 314) may be disposed near the center of the conductive element 306. In this instance, the inductors 312, 314 may be located near the antinode of the magnetic field. In this way, the inductors 312, 314 may be exposed to the maximum magnitude of the magnetic field generated by the signal received from the VHF power source 112. Accordingly, the current induced in the inductors 312, 314 may be related to or in proportion to the magnitude of the magnetic field. The alternating direction of the magnetic field may induce an alternating current in each of the inductors 312, 314 that may be approximately 180 degrees out of phase in each direction. In this way, the current, or power generated by the current, may be split between a first output 228 and a second output 230 for the first inductor 314 and a third output 224 and a fourth output 226 for the second inductor 312. The phase of the third output 224 and the fourth output 226 may be altered by the respective delay components 324, 326, such that the four outputs are out of phase with each other by about 90 degrees. Hence, the first output 228 signal and the second output 230 signal may be about 180 degrees out of phase from each other and the third output 224 signal and the fourth output 226 signal may also be about 180 degrees out of phase with each other. The delay components 324, 326 may alter the third output 324 signal such that it is about 90 degrees out of phase with either the first output 228 signal or the second output 230 signal and the fourth output 226 signal is also about 90 degrees out of phase with the first output 228 signal or the second output 230. For examples, relative to each of the output signals, the first output 228 signal may be about zero degrees, the third output 224 may be about 90 degrees, the second output 230 may be about 180 degrees, and the fourth output 226 may be about 270 degrees. Accordingly, the power may alternate or rotate around the phasor electrode 222 as a result of each of the four outputs being out of phase with each other.

For purposes of explanation, the coils of the inductor may be induced to flow current by the presence of a nearby magnetic field. The coils of the inductor may form a magnetic field intercept surface area that extends between the continuous portions of the wire that form the inductor. For example, in a loop inductor (not shown) that may be formed by a wire that forms a circular loop, the magnetic field intercept surface area may be formed within the plane of the interior portion of the circular loop. In this way, when a magnetic field is passes through magnetic field intercept surface area and is perpendicular to the magnetic field intercept surface area, the magnetic field may induce a relative maximum amount of current in the circular loop inductor. Similarly, another magnetic flux intercept surface area may be formed between the coil wire of the inductor 312, 314. The magnetic field may be intercepted by magnetic field intercept surface area of the inductor 312, 314 which may induce current flow through the inductor 312, 314. In another embodiment, the magnetic flux intercept surface area may be similar to a Gaussian surface that may be used to determine the flux of a magnetic field. The boundaries of the Gaussian surface may be determined by the arrangement of the wire that may form the inductor. The wire arrangement may be, but is not limited to, a circular loop or a coil as shown in FIG. 3 (e.g., inductor 312).

Accordingly, in the FIG. 3 embodiment, the inductor 312 may also have a magnetic flux intercept surface area that may be positioned to be perpendicular to the magnetic field generated by the conductive element 306. In this embodiment, the inductors 312, 314 may be placed substantially parallel to the conductive element 202, such that the magnetic flux intercept surface area may be substantially perpendicular to the magnetic field generated by the conductive element 202. However, the system 200 may still be operational when the magnetic flux intercept surface area of the inductor 212 is not substantially parallel to the magnetic field generated by the conductive element 202. The positioning of the magnetic flux intercept surface area in a substantially perpendicular manner merely increases the efficiency of inducing more current through the inductor 212. The perpendicular arrangement of magnetic field and the intercept surface area may not be required to operate the system 300 as described in this application.

In another embodiment, the conductive element 306 may be arranged in any geometric manner that may enable an alternating current flow generated from the VHF power source 112. The geometric conductive element (not shown) may maintain an alternating magnetic field (not shown) that may include an antinode that designates the location of the maximum magnitude of the magnetic field. Accordingly, an inductor (not shown) may be placed near, adjacent to, or at the antinode. In another embodiment, the inductor may be disposed along a majority of the length of the conductive element. The conductive element may have an antinode location that may be based, at least in part, on the geometry of the conductive element. In this way, the inductor may disposed or arranged in a manner that uses or exploits the antinode to optimize the amount of current that can be induced within the inductor. For example, the conductive element may be arranged in coil-like (e.g., helical) geometry between the first capacitor 308 and the second capacitor 310. In this instance, the inductor (not shown) may also be arranged in a coil-like geometry to intersect or to be adjacent to the antinode of the coil-like conductive element. For example, the coil-like conductive element and inductor may include windings that are arranged in approximately an opposite manner. The windings for each component may have wave a like geometry and may be arranged in a way that the geometric waves of the components are out of phase with each other. In one specific embodiment, the geometric waves may appear to be approximately 180 degrees out of phase.

In other embodiments, the conductive element 306 and the inductor are arranged, such that the inductor 312 is parallel to the magnetic field of the conductive element. In this instance, the conductive element (not shown) may not be linear as shown in FIG. 3.

The power splitter 300 may also include impedance capacitor 318 that may be tuned to match the impedance of the VHF power source 112 and the impedance of the process chamber 102 or any other output device that may be coupled to the power splitter 300. Impedance may be an indication of an amount of opposition a circuit has to alternating current. In addition to resistance, the impedance may also reflect the opposition caused by inductance or capacitance generated in an AC circuit. In the embodiment illustrated in FIG. 3, the impedance capacitor 318 may be coupled to electrical ground 220.

Figure 4:
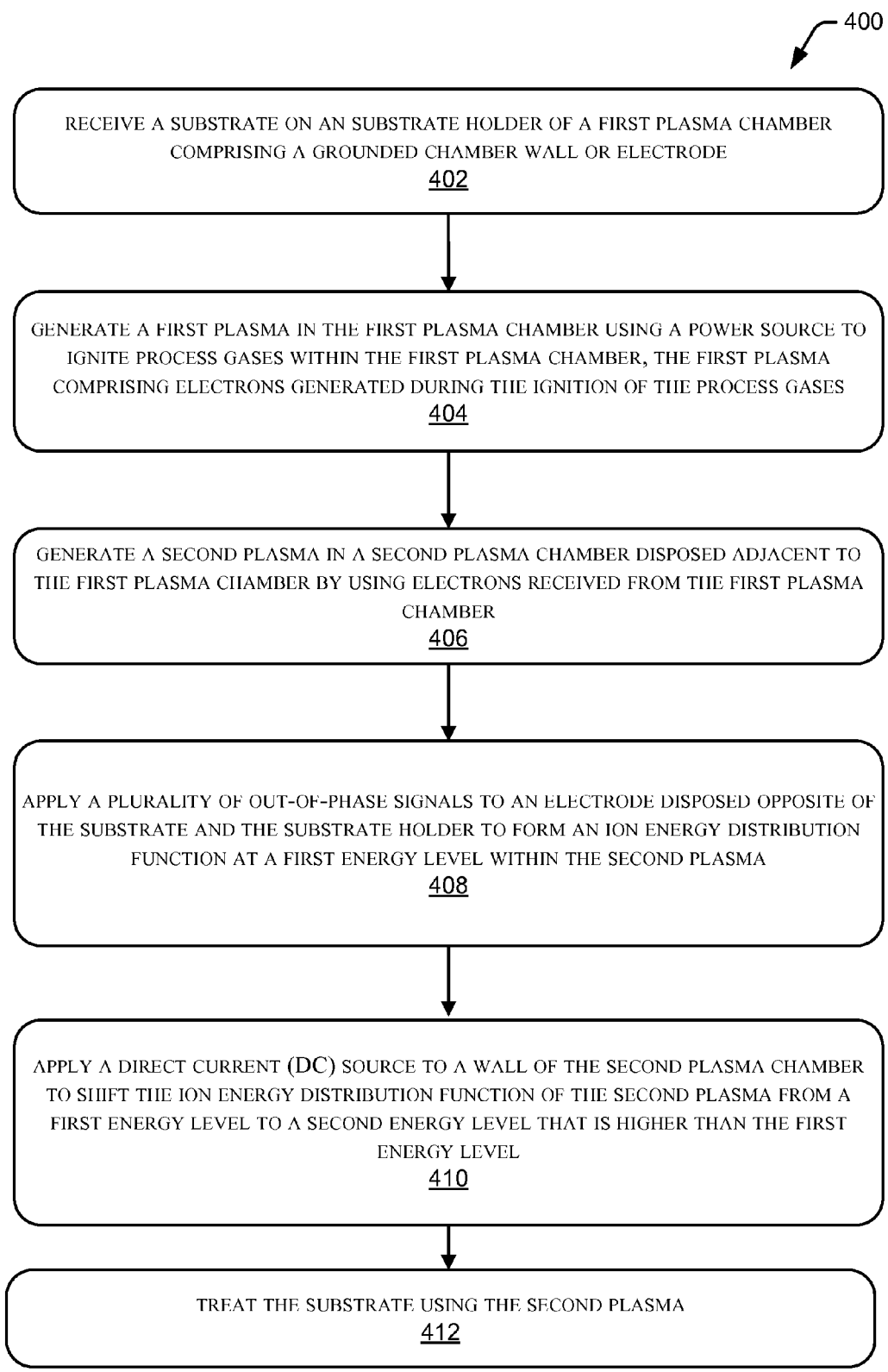
FIG. 4 is a flow diagram for a method for generating plasma in the non-ambipolar plasma system processing system.

FIG. 4 is a flow diagram 400 for a method for generating plasma in the non-ambipolar plasma system processing system 200. The plasma processing systems shown in FIG. 1 and FIG. 2 may be used to generate a plasma density profile 116 and ion energy distribution profile 124 to treat substrates 212 using an etching or deposition process. In one embodiment, the plasma chamber 102 may be designed to incorporate a first plasma chamber 202 that may inject electrons into the second plasma chamber 206 to generate the plasma conditions described in the description of FIG. 1. The second plasma chamber 206 may also be used to shift the IEDf (ion energy distribution function) to higher energies as described in the description of FIG. 1.

At block 402, the plasma chamber 102 may receive a substrate 212 that may be placed on a substrate holder (e.g., phasor electrode 222) of a plasma chamber (e.g., second plasma chamber 206) that is adjacent to a non-ambipolar ion plasma (NIP) chamber (e.g., first plasma chamber 202). The substrate 212 may include any type of material that may be etched or deposited on using plasma. The substrate 212 may made of silicon or gallium arsenide or any other material that may be used to manufacture electronic devices. The substrate 212 may include layers of films or structures that may be etched by or deposited on using the plasma. The substrate 212 may be or aligned with the four VHF outputs of the phasor electrode 222 and disposed opposite from the first plasma chamber 202.

The vacuum system 108 may be used to evacuate the plasma chamber 102 to a relatively low pressure (e.g., <1 Torr) and the gas delivery system 104 may provide one or more process gases such as, but not limited to, nitrogen, argon, halogen-based gases, or a combination thereof. The first plasma chamber 202 may also be used as a gas plenum to deliver the process gases to the second chamber 206. The gas may be distributed through the openings 216 or via gas plenum ducts (not shown) that may provide the gas to the second plasma chamber 206 without introducing them directly into the first plasma chamber 206. The process controller 114 may be used to generate proper ambient conditions within the first plasma chamber and/or the second plasma chamber 206, such that plasma may be generated by igniting the process gases within the plasma chamber 102.

At block 404, the process controller may generate or ignite the process gases within the plasma chamber 102 comprising the first plasma chamber 202 and the second plasma chamber 206. In one embodiment, the first plasma chamber 202 may use an radio frequency (RF) power source 106 to provide energy that may be used to ignite the plasma in the first plasma chamber 202. The energy may be provided by an RF electrode 215 that is electrically isolated from the grounded walls of the first plasma chamber 202. In certain embodiments, the first plasma chamber 202 may include a grounded anode that may be coupled to the chamber walls, instead of grounding the interior walls of the first plasma chamber 202. In one embodiment, the RF power may comprise a magnitude of no more than 500 W and a frequency less than 5 GHz. In another embodiment, the RF power may be more than 300 W and at least 100 MHz. The first plasma 204 may be maintained at a first plasma potential ($V_{p,1}$) that may include an electron flux that may be directed towards the second plasma chamber 206, such that electron flux may be used to ignite a second plasma 208.

At block 406, generating a second plasma 208 in a second plasma chamber 206 disposed adjacent to the first plasma chamber 202 by using electrons 210 received from the first plasma chamber 202. The second plasma chamber 206 may be maintained at a pressure of no more than 500 mTorr by the vacuum system 108 and the process controller 114. The process gases inside the second plasma chamber may include, but are not limited to, argon, nitrogen, halogen-based gas(es), oxygen, or a combination thereof.

At block 408, the process controller 114 may enable the application of a plurality of out-of-phase signals to an electrode (e.g., phasor electrode 222) disposed opposite of the substrate 212 and the substrate holder to form an ion energy distribution function (e.g., IEDf plot 124) at a first energy level within the second plasma 208. The first energy level may be less than 300 eV and may have an energy distribution of no more than 50 eV around the peak ion energy. In one embodiment, a first set of electrodes (e.g., first output 224, second output 226) may receive a first plurality of power signals that are about 180 degrees out of phase with each other from the VHF power source 112. A second set of electrodes (e.g., third output 228, fourth output 230) may receive a second plurality of power signals that may also be 180 degrees of out phase with each other from the same or another VHF power source 112.

In one embodiment, the phase angle relationship between the four output signals may be configured to be offset from each other by about 90 degrees. For example, the first output 224 may have a phase angle of about zero degrees, the second output 226 may have a phase angle of about 180 degrees, the third output 228 may have a phase angle of about 90 degrees, and the fourth output 230 may have a phase angle of about 270 degrees. In this way, the power provided to the second plasma 208 may rotate around the phasor electrode 222 at a frequency set by the process controller 114 and enabled by the VHF power source 112. In other embodiments, the phase angle difference between power signals emitted from the phasor electrode 222 outputs may range between 60 degrees and 120 degrees. In one specific embodiment, the frequency of the power provided by the VHF power source 112 may be about 100 MHz. However, in other embodiments, the frequency may be no more than 1 GHz.

The second plasma 208 may have a relatively tight IEDf, but in some instances may a relatively low first energy value, as shown in the IEDf plot 124. In certain instances, it may be desirable to have plasma conditions with a much higher energy. One approach to increase the energy and maintain a relatively tight IEDf may be to shift the energy upward by applying additional power to the second plasma 208.

At block 410, the process controller 114 may enable the application of a direct current (DC) power source 110 to the second plasma 208 via a wall of the second plasma chamber 208 or an electrode that may be adjacent to the second plasma 208. In this way, the ion energy distribution function (e.g., IEDf plot 124)) of the second plasma 208 may shift from a first energy level to a second energy level that may be higher than the first energy level. The energy may shift up to as high as 10 keV in some embodiments In one embodiment, the DC power source 110 may apply a positive voltage of at least 1V to the second plasma chamber 206.

At block 412, the second plasma 208 may be used to treat the substrate 212 using the second plasma. 208 by etching the surface of the substrate 212 or depositing a film on the substrate 212.

It is to be appreciated that the Detailed Description section, and not the Abstract section, is intended to be used to interpret the claims. The Abstract section can set forth one or more, but not all exemplary embodiments, of the present disclosure, and thus, is not intended to limit the present disclosure and the appended claims in any way.

While the present disclosure has been illustrated by the description of one or more embodiments thereof, and while the embodiments have been described in considerable detail, they are not intended to restrict or in any way limit the scope of the appended claims to such detail. Additional advantages and modifications will readily appear to those skilled in art. The invention in its broader aspects is therefore not limited to the specific details, representative apparatus and method and illustrative examples shown and described. Accordingly, departures may be made from such details without departing from the scope of the general inventive concept.

What is claimed is:

1. A plasma processing system, comprising:
   a process controller;
   a first plasma chamber comprising an electrically grounded chamber wall that forms a gas plenum for the plasma processing system;
   a second plasma chamber opposite the first plasma chamber comprising:
      a substrate holder configured to hold a substrate;
      a direct current (DC) voltage electrode; and
      a dielectric electron injector plate disposed between the first plasma chamber and the second plasma chamber;
   a radio frequency (RF) power splitter including a conductive element configured to transmit an alternating current in a standing wave that comprises a low voltage point near a center of the conductive element, the conductive element being configured to generate a magnetic field that extends around an axis of the conductive element when the alternating current is received from a RF generator;
   a first inductor and a second inductor that are physically separate from the conductive element and adjacent to the low voltage point and are configured to receive the magnetic field that is generated by the conductive element, each of the inductors comprising:
      (i) a first end configured to transmit current based, at least in part, on the inductor receiving the magnetic field;
      (ii) a second end configured to transmit current based, at least in part, on the inductor receiving the magnetic field, the current from the second end being out of phase from the current configured to be transmitted from the first end;

wherein the substrate holder includes a very high frequency (VHF) electrode opposite the first plasma chamber, the VHF electrode comprising:
(i) a first plurality of elements configured to receive a first VHF RF power signal; and
(ii) a second plurality of elements configured to receive a second VHF RF power signal, the second plurality of elements and the first plurality of elements being symmetrical to each other,
wherein the first end and the second end of the first inductor are coupled to the first plurality of elements,
wherein the first end and the second end of the second inductor are coupled to the second plurality of elements,
wherein the first plurality of elements and the second plurality of elements are disposed within the substrate holder such that the first plurality of elements and the second plurality of elements are adjacent to the substrate, and
wherein the process controller is configured to apply the first VHF RF power signal and the second VHF RF power signal such that a phase angle relationship between each of the first and second plurality of elements is between 60-120 degrees to form an ion energy distribution function at a first energy level within the second plasma chamber.

2. The system of claim 1, wherein the first plasma chamber further comprises:
a power window that enables transmission of radio frequency (RF) power into the first plasma chamber; and
a power source that provides the RF power through the power window.

3. The system of claim 2, wherein the power window is opposite the dielectric electron injector plate.

4. The system of claim 1, wherein the dielectric electron injector plate comprises a gas delivery system that is in fluid communication with the second plasma chamber that comprises an exhaust port for removing gas from the second plasma chamber.

5. The system of claim 4, wherein the first plasma chamber comprises a pumping system that maintains a pressure difference between the first plasma chamber and the second plasma chamber.

6. The system of claim 1, further comprising an adjustable gap system that varies a separation distance between the first plasma chamber and the substrate holder.

7. The system of claim 1, wherein the process controller is configured to apply a direct current (DC) source to a wall of the second plasma chamber to shift the ion energy distribution function of the second plasma from the first energy level to a second energy level that is higher than the first energy level.

8. The system of claim 1, further comprising a VHF power source that is configured to generate the first VHF RF power signal and the second VHF RF power signal.

9. The system of claim 8, wherein the conductive element is connected to the VHF power source and disposed within the substrate holder between the first plurality of elements and the second plurality of elements.

10. The system of claim 9, wherein the conductive element includes a rod disposed between a first tuning capacitor and a second tuning capacitor, wherein the first and second tuning capacitors are configured to adjust an alternating current flow from the VHF power source.

11. A plasma processing system, comprising:
a gas plenum coupled to electrical ground;
a substrate holder configured to hold a substrate, the substrate holder including a very high frequency (VHF) electrode opposite the gas plenum, the VHF electrode comprising:
(i) a first plurality of power elements configured to receive a first VHF power signal, and
(ii) a second plurality of power elements configured to receive a second VHF power signal;
a direct current (DC) voltage source disposed between the gas plenum and the VHF electrode;
a gap system configured to adjust a distance between the gas plenum and the VHF electrode; and
a process controller configured to drive electrons toward the substrate by adjusting the DC voltage, the first VHF power signal, the second VHF power signal, and a gap distance between the gas plenum and the VHF RF electrode,
a radio frequency (RF) power splitter including a conductive element configured to transmit an alternating current in a standing wave that comprises a low voltage point near a center of the conductive element, the conductive element being configured to generate a magnetic field that extends around an axis of the conductive element when the alternating current is received from a RF generator;
a first inductor and a second inductor that are physically separate from the conductive element and adjacent to the low voltage point and are configured to receive the magnetic field that is generated by the conductive element, each of the inductors comprising:
(i) a first end configured to transmit current based, at least in part, on the inductor receiving the magnetic field;
(ii) a second end configured to transmit current based, at least in part, on the inductor receiving the magnetic field, the current from the second end being out of phase from the current configured to be transmitted from the first end;
wherein the first end and the second end of the first inductor are coupled to the first plurality of elements,
wherein the first end and the second end of the second inductor are coupled to the second plurality of elements,
wherein the process controller is configured to apply the first VHF RF power signal and the second VHF RF power signal such that a phase angle relationship between each of the first and second plurality of elements is between 60-120 degrees to form an ion energy distribution function at a first energy level, and
wherein the first plurality of elements and second plurality of elements are disposed within the substrate holder such that the first plurality of elements and second plurality of elements are adjacent to the substrate.

12. The system of claim 11, further comprising a transmission port in the gas plenum that enables RF power to be transmitted into the gas plenum.

13. The system of claim 11, wherein the first plurality of power elements and the second plurality of power elements are symmetrical to each other.

14. The system of claim 11, wherein the process controller is configured to make the first VHF power signal and the second VHF power signal out of phase with each other.

15. The system of claim 11, wherein the process controller is configured to make the first VHF power signal and the second VHF power signal out of phase with each other between 60 and 120 degrees.

16. The system of claim 11, wherein the first plurality of power elements and the second plurality of power elements are asymmetrical to each other.

\* \* \* \* \*